United States Patent [19]

Bergman et al.

[11] 4,448,799

[45] May 15, 1984

[54] ARC-INITIATING TRIGGER APPARATUS AND METHOD FOR ELECTRIC ARC VAPOR DEPOSITION COATING SYSTEMS

[75] Inventors: Clark Bergman, Roseville; Gary E. Vergason, Minneapolis; Robert Clark, Vadnais Heights; Shannon Bosak, Minneapolis, all of Minn.

[73] Assignee: Multi-Arc Vacuum Systems Inc., Saint Paul, Minn.

[21] Appl. No.: 487,145

[22] Filed: Apr. 21, 1983

[51] Int. Cl.³ .............................................. B05D 3/06
[52] U.S. Cl. ................................. 427/37; 118/50.1; 313/146; 313/595
[58] Field of Search .................. 427/37; 219/121 ET, 219/123, 124.01; 313/146, 595; 118/50.1, 620

[56] References Cited

U.S. PATENT DOCUMENTS

| | | | |
|---|---|---|---|
| 3,488,546 | 1/1970 | Paquette | 313/146 |
| 3,625,848 | 12/1971 | Snaper | 427/37 |
| 3,783,231 | 1/1974 | Sablev et al. | 219/121 ET |
| 4,071,727 | 1/1978 | Crouch et al. | 313/146 |

FOREIGN PATENT DOCUMENTS

1378699 10/1964 France ............................... 313/146

Primary Examiner—John H. Newsome
Attorney, Agent, or Firm—Merchant, Gould, Smith, Edell, Welter & Schmidt

[57] ABSTRACT

A trigger apparatus and method for striking an electrical arc at the surface of a coating source material within a vapor deposition chamber is disclosed. A plunger member is mounted for axial movement in a housing configured for attachment to an inlet port of a deposition chamber. The plunger has one end adapted to carry an arc-initiating wire contact. A pneumatic drive cylinder axially reciprocates the plunger member with positive force strokes in both directions such that the wire contact alternately engages and disengages the surface of the cathode source material. Seal means are provided for maintaining a vacuum seal of the deposition chamber through the trigger apparatus. Dynamic shield means are mounted adjacent the inlet port for protecting the seal members from being coated by vapor particles within the deposition chamber. Alignment means cooperatively engage the plunger member for maintaining a positive angular position of the plunger member during reciprocal motion thereof.

34 Claims, 4 Drawing Figures

ARC-INITIATING TRIGGER APPARATUS AND METHOD FOR ELECTRIC ARC VAPOR DEPOSITION COATING SYSTEMS

FIELD OF THE INVENTION

This invention relates generally to electric arc vacuum physical vapor deposition coating systems, and in particular to a trigger apparatus and metal for striking an electric arc on the coating source electrode material to initiate generation of a coating plasma within the deposition chamber.

DESCRIPTION OF THE PRIOR ART

Physical vapor deposition coating systems and processes for coating substrates within an "evacuated" chamber, are well-known in the art. Physical vapor deposition processes are generally carried out in evacuated chambers. The substrates to be coated may be placed in the deposition chamber prior to its evacuation, or in continuous process systems, introduced from an evacuated "load-lock" when space is available. Typically, the coating material is present in the deposition chamber as a solid source material, and is acted upon by a stimulus that converts the coating source material into a "plasma" of vapors and solid particulate matter. Once converted, (often referred to as "evaporated") into a vapor, the coating source material may be combined with other reactive gases or elements within the chamber to form coating compounds and molecules. The coating plasma typically includes atoms, molecules, ions, ionized molecules and agglomerates of molecules. The coating plasma generally travels from the coating source toward the substrates to be coated in a line-of-sight manner. Electric and magnetic fields may be used to further shape or define the line-of-sight plasma coating stream, and electrostatic attraction may be used by biasing the substrates in a manner so as to attract ionized plasma particles.

Various physical vapor deposition techniques are known by the methods they use for converting the solid coating source material into a gaseous vapor and/or plasma phase. The most commonly used physical vapor deposition techniques for converting solid coating source materials through a gaseous vapor and/or plasma phase and finally to a solid film on the substrates of interest are:
1. the resistance or induction-heating technique;
2. the electron beam or ion-bombardment evaporation technique;
3. the gas-discharge sputtering technique; and
4. the electric arc technique.

In the resistance or induction-heating technique, the solid source material is converted to a molten state by passing current through the source material or a carrier boat or wire basket, that is in intimate contact with the source material. As the source material melts, atoms and molecules at the surface evaporate to form the coating vapor. In electron beam or ion-bombardment techniques, the coating vapor is formed by bombarding the coating source material with a high-energy beam of electrons and/or ions. Energy lost by the bombarding particles melts the source material. As with the induction-heating technique, the coating vapor includes atoms and molecules evaporating from the surface of the molten pool. In the gas-discharge sputtering technique, the coating vapor is formed by bombarding the coating source material with high-energy ions. The coating vapor formed by this technique includes atoms, clusters of atoms, and some ions which are "sputtered" from the surface of the solid source.

The electric arc technique, to which this invention pertains, forms the coating plasma by means of electric arc energy impinging upon the coating source material. The coating source material is electrically biased to act as a cathode of the system. The outer housing of the chamber, or a separate electrode surface within the chamber, is spaced from the cathode, and electrically biased to serve as the anode of the system. An arc initiating apparatus, generally referred to as a "trigger" assembly initiates an arc within the chamber, by touching the cathode coating source material surface with an arc-initiating wire. An electric current path is established through the arc initiating wire and the cathode soure material, by appropriate power source means. Subsequent removal of the arc-initiating wire from engagement with the cathode surface creates an electric arc between the wire and the cathode surface. The initiated arc immediately establishes electrical current flow (arc) paths between the cathode source material and the anode surfaces, which paths are maintained by the electrical biasing circuits for the electrodes. High electrical current levels, typically in excess of 30 Amperes, pass through such electrical arc paths. The concentration of electrical energy passing through the arc is visible on the surface of the cathode source where the arc touches the cathode, and is typically referred to as a "cathode" spot. Typically, once an arc is initiated, multiple cathode spots will simultaneously appear on the cathode surface. The cathode spots move in erratic, random manner across the surface of the source material, instantaneously vaporizing the coating source material at the cathode spot location, to form the coating plasma. An example of an electric arc vapor vacuum deposition system, as above described, is illustrated in more detail in U.S. Pat. No. 3,783,231 to Sablev et al.

The electric arc physical vapor deposition technique as described herein, and to which this invention pertains, should not be confused with the "plasma torch" art, which typically uses an electric arc at "normal" atmospheric pressures to "melt" source material for projection under gaseous pressure toward an object Such plasma torches do not require or use a vacuum, involve principles of operation quite different from those of the electric arc vacuum vapor deposition art, and neither involve the severe environmental conditions nor the unique problems which are addressed by the present invention.

While the principles of operation of an electric arc vapor deposition system are fairly simple, control of the various parameters involved in the system and protection of operable components of the system from the severe environmental conditions to which they are exposed, have largely limited the use of such systems for commercial substrate coating applications. While all of the physical deposition coating techniques experience a number of the same operation problems (such as maintaining a vacuum, preventing contamination of the coating chamber, depositing a uniform coating to the substrates, maintaining operability of moving and/or electrical parts within the coating chamber, preventing build-up of coating material on chamber parts that are critical to the system operation, etc.) such problems can be more severe with electric arc vapor deposition systems.

The arc-initiating trigger apparatus is fundamental to the operation of the electric arc vapor deposition system. The trigger apparatus not only strikes an arc that "starts" the plasma generation process, but also is required to "restart" the process thereafter if for any reason the electric arc between the cathode and the anode should be extinguished. In electric arc vapor coating processes, it is not uncommon for the electric arcs in the chamber to extinguish a number of times, with each such event requiring reactivation by the trigger apparatus. In such instances, when the trigger apparatus is called upon to perform its function, it is essential that the trigger apparatus operate reliably and properly. Failure of the trigger apparatus to properly perform, can cause an aborted coating cycle. Such trigger failure can be extremely costly due to the lost time in opening and cleaning the chamber, replacement of the defective trigger, and re-evacuation of the chamber, and also due to potential damage and possible loss of the substrates that were being coated at the time of the failure. Accordingly, the trigger apparatus is a very essential element of an electric arc vapor deposition assembly.

Arc-initiating trigger assemblies of the prior art have been generally unreliable, difficult to maintain, costly, and inadequate for performing their required functions. Most prior art trigger assemblies often did not last through a single deposition coating run without requiring special attention to insure their operability, and typically required replacement, or at least thorough cleaning, after only several process runs. The unreliability of such prior art trigger assemblies would manifest itself in a number of different failure modes, and was primarily due to the nature of construction of such trigger assemblies. Most prior art trigger assemblies employ an electromagnetic coil structure for moving the arc-initiating wire into engagement with the cathode surface, and depend upon a compressed spring to "return" the wire to its disengaged position after de-energization of the coil. The amount of power typically available with such trigger structures, to "pull" the arc-initiating wire into engagement with the cathode surface, and to simultaneously compress the return spring, was typically on the order of two to three pounds but could be significantly higher (e.g. eight to ten pounds). However, the return spring force is generally fairly low, being only on the order of two to three pounds. Such low return force is often inadequate to disengage the arc-initiating wire from engagement with the cathode surface. As the arc-initiating current passes through the wire that engages the cathode surface, there is a tendency for the wire to "weld" to the cathode surface, forming a bond which must be broken by the return spring force in order to disengage the arc-initiating wire from the cathode surface. With the low return force available with prior art trigger assemblies as above described, it is often impossible for the return spring to unseat the "welded" wire from the cathode surface. To further add to the problem, the heat generated by arc-initiating current passing through the spring on its path to the engagement wire often causes the spring itself to lose its initial temper or spring constant, further reducing the return spring force available for unseating a "stuck" trigger wire. In addition, the heat passing through the trigger apparatus, primarily as a result of "welded" or "stuck" trigger wipes can directly damage the energizing coils themselves, by melting or burning their insulation layers and resistive components.

The design constraints of such prior art electromagnetic trigger assemblies further add to their unattractiveness for use in electric arc vapor deposition systems. To generate even the two to three pound pulling force, such trigger structures require bulky and expensive electromagnetic coils. To obtain higher "pull" forces would require still larger physical units. Such larger physical size constraint of such triggers provides further problems.

When using such electromagnetic arc-initiating trigger assemblies, it is desirable to place the trigger housing as close as possible to the cathode source material itself. Otherwise, even larger coils are needed to operate the arc-initiating wire over the extended distance. Since the cathode itself requires space for providing mechanical and electrical connection and cooling, such requirement for close proximity mounting of the trigger housing to the cathode source structure effectively limits the physical size of the trigger apparatus coil, thus limiting the pull strength of the electromagnetic assembly.

Another problem associated with electromagnetic coil activated trigger assemblies is that the radial orientation of the movable shaft passing through the coil cannot be directly controlled, which would permit the arc-initiating wire to be directly connected to such shaft for positive orientation relative to the cathode source. To address this situation, the arc-initiating wire of the prior art is generally pivotally mounted within the deposition chamber and the movable member of trigger assembly is connected thereto such that the trigger operates the arc-initiating wire through a lever arrangement. Such arrangement limits the "stroke" or "travel" distance of the wire with respect to the upper surface of the cathode source, and wastes the limited forces available from the solenoid coil and spring. Further, with such lever arrangements, it is difficult to insure that the arc-initiating wire will have a sufficient "stroke" to continuously "reach" the cathode source surface of the source material as it changes shape due to vaporization into the plasma during a coating operation.

Besides from the electrical design deficiencies of such systems another problem associated with prior art trigger assemblies has been their inability to maintain a good vacuum seal through the trigger assembly, when connected to the deposition chamber. Some prior art electromagnetic trigger assemblies used a single seal member positioned around the movable trigger member, for maintaining a vacuum seal between the inside coating chamber and the external environment as well as to provide electrical isolation between the trigger member and the deposition chamber. Typically such seals were of an "O"-ring nature. Normal coating operations within the chamber tended to rapidly deposit coating material on the trigger seal structure, often leading to a short circuit across the coated seal, establishing a current flow path directly between the trigger apparatus and the chamber housing, instead of maintaining electrical current flow through the arc-initiating wire. Such short circuiting sometimes caused the seal member to actually weld itself to the chamber, and typically resulted in physical burning of the seal member, thus destroying or damaging the vacuum seal and/or injecting contaminating particles into the vacuum chamber. Further, due to the electromagnetic construction of the activating trigger, it was virtually impossible to employ differential pumping techniques for accommodating such seal leaks so as to maintain the chamber vacuum.

The present invention directly addresses the above-mentioned problems and deficiencies of prior art arc-initiating trigger structures. The present invention provides a trigger assembly that features reliability of use over extended periods of time as compared to the prior art, and which requires little maintenance. The trigger apparatus of this invention significantly minimizes possibility of "welding" of the arc-initiating contact wire to the cathode surface, and provides for a uniform stroke motion of the arc-initiating wire over extended periods of use. The trigger apparatus of this invention enables direct connection of the trigger assembly's prime mover structure to the arc-initiating wire, without the requirement for any indirect pivot or lever configurations heretofore used. The present invention provides a trigger apparatus that is physically compatible with close proximity mounting to the cathode source, while providing strong engagement and disengagement forces to move the contact wire, without the use of any mechanical spring structures. The present invention provides a trigger apparatus that virtually addresses the heretofore troublesome problem of maintaining an adequate vacuum seal and electrical isolation between the trigger apparatus and the internal chamber of the deposition system, and provides for differential pumping of the seal chamber in the event of seal leakage. These and other advantages and features of the present invention will become clear upon a more detailed description of the invention.

SUMMARY OF THE INVENTION

The present invention provides a simple and reliable apparatus and method for initiating and maintaining an electric arc at the coating source material surface within an electric-arc vacuum physical vapor deposition chamber. The apparatus and method of this invention provides for significantly improved vacuum seal life and reliability through the inlet port to which the trigger appratus is mounted, minimizes welding of the arc-initiating contact to the coating source material and minimizes maintenance and down time of the coating chamber due to trigger apparatus failure. According to one configuration of the invention there is provided an arc-initiating apparatus of the type suitable for mounting to a port of a vapor deposition chamber, for moving an arc-initiating rod or contact into and out of engagement with a cathode source surface during an electric arc vapor deposition process, comprising:
(a) a housing defining an internal cavity having oppositely disposed ends;
(b) means for mounting the housing to a port of a vapor deposition chamber;
(c) a plunger shaft axially extending between first and second ends and slidably mounted for axial movement within the internal cavity of the housing;
(d) seal means arranged and configured for maintaining a vacuum seal at the chamber port, between the chamber and the housing;
(e) contact rod means operatively connected to the second end of the plunger for moving in response thereto, and having an engagement portion configured and arranged for selectively engaging a surface of a cathode source mounted in the vapor deposition chamber, wherein the contact rod means responds to axial movement of the plunger shaft to selectively engage and disengage the cathode source surface, and
(f) pneumatic cylinder means having a prime mover operatively connected with the first end of the plunger shaft for positively axially moving the plunger shaft between extended and retracted positions.

When the plunger shaft is positioned in its retracted position the contact rod means operatively engages the cathode source surface; and when the plunger shaft is positioned in its extended position, the contact rod means is moved out of engagement with the cathode source surface.

The trigger apparatus of this invention further includes means connected with the plunger shaft for maintaining the rotational position of the shaft about its axis at a fixed angular attitude as the shaft moves between its extended and retracted positions, thereby insuring that the contact rod carried by the plunger shaft will always engage the cathode source surface at the same spot. According to one embodiment of the invention, the seal means of the trigger appratus includes first seal means mounted in the cylindrical housing cavity and forming a sliding seal with the plunger shaft; and second seal means disposed between the mounting means and the chamber wall for maintaining a vacuum seal therebetween. Shield means are provided at the inlet port of the chamber for shielding the seal means from coating by vaporized coating material from the chamber. According to one embodiment of the invention, such shield means are coaxially mounted with the plunger shaft and include axially spaced fluted portions for minimizing bridging of conductive coating material along the shield means.

According to a preferred construction of the invention, the trigger apparatus housing is electrically isolated from the deposition chamber wall by means of an insulator member, and conductor means are provided for establishing current flow through the plunger shaft and its attached contact rod member, to the engaged surface of the coating source material. In a preferred construction, the contact rod member comprises a molybdenum contact wire.

In a preferred construction of the trigger apparatus, the drive means for the plunger member comprises a pneumatic drive cylinder that imparts prime mover forces to the plunger member of substantially equal force for movement of the plunger member toward both the retracted and the extended positions. A preferred force imparted to the plunger member is between ten and 30 pounds.

In a preferred construction of the invention, the seal means which engage the reciprically moving plunger shaft are in the form of axially spaced slider seal members mounted within the housing cavity. The housing cavity may be provided with access port means adjacent the slider seal members for providing differential evacuation pumping of the housing cavity between the pair of seal members.

According to another aspect of the invention, there is provided an arc-initiating trigger apparatus for use with an electric-arc vacuum vapor deposition chamber, comprising:
(a) a housing having one end suitable for attachment to a vacuum vapor deposition chamber adjacent an inlet port extending into an internal cavity of the chamber;
(b) a plunger longitudinally extending between first and second ends and configured for passing an electrical signal therethrough;
(c) means for mounting the plunger for oriented longitudinal movement between extended and retracted positions within the housing, wherein the second end of the plunger reciprocally moves toward and away from the one housing end;

(d) seal means cooperatively engaging the plunger and the housing for forming a dynamic seal therebetween as the plunger moves;

(e) shield means operatively mounted adjacent the one end of the housing and configured to project into the chamber inlet port for shielding the seal means from vapor deposition particles passing from the chamber and through the inlet port; and (f) drive means operatively connected to the plunger adjacent its first end for reciprocally, positively moving the plunger between its extended and retracted positions.

The invention also includes a method of actuating an arc-initiating trigger apparatus of the type used in electric arc vapor deposition chambers which contain a coating source material from which an electric arc is struck; wherein the trigger apparatus is generally of the type which includes a housing mounted to the deposition chamber at an inlet port thereof, a plunger member mounted for reciprocal longitudinal movement in the housing and having one end extending through the chamber inlet port and into the inner cavity of the chamber and an arc-initiating wire carried by the plunger member and movable thereby into and out of engagement with the coating source material, comprising the steps of:

(a) axially reciprocating the plunger member between extended and retracted positions, wherein the arc-initiating wire carried thereby is moved into and out of engagement with the coating source material;

(b) maintaining the angular rotation of the plunger member in a predetermined position throughout reciprocation of the plunger member, wherein the arc-initiating wire repeatedly engages the same portion of the coating source material on each reciprocal cycle; and (c) maintaining a vacuum seal at the chamber inlet port and through the trigger apparatus during the reciprocatory motion of the plunger member.

While the present invention will be described with respect to the use of certain materials in the construction of the preferred embodiment, it will be understood that the invention is not limited to the use of such materials. Further, while the invention will be described with respect to certain seal configurations that have been found to perform well with the particular configuration of the preferred embodiments disclosed, it will be understood that the invention is not limited to the details of such seal configurations. Similarly, while the invention illustrated by the preferred embodiment thereof will describe a particular configuration for shielding the seal members, it will be understood that other shield means may equally well be used within the scope of this invention. Further, while a particular alignment and orientation structure will be described with regard to maintaining the angular orientation of the plunger shaft at a predetermined position during longitudinal movement of the shaft, it will be understood that other alignment configurations could also be used within the scope of this invention. It will be understood that those skilled in the art may readily perceive yet other variations of the invention not specifically described above or in the following specification, but which are clearly included within the scope of the appended claims.

BRIEF DESCRIPTION OF THE DRAWING

Referring to the Drawing, wherein like numerals represent like parts throughout the several views.

DETAILED DESCRIPTION OF THE INVENTION

Figure 1:
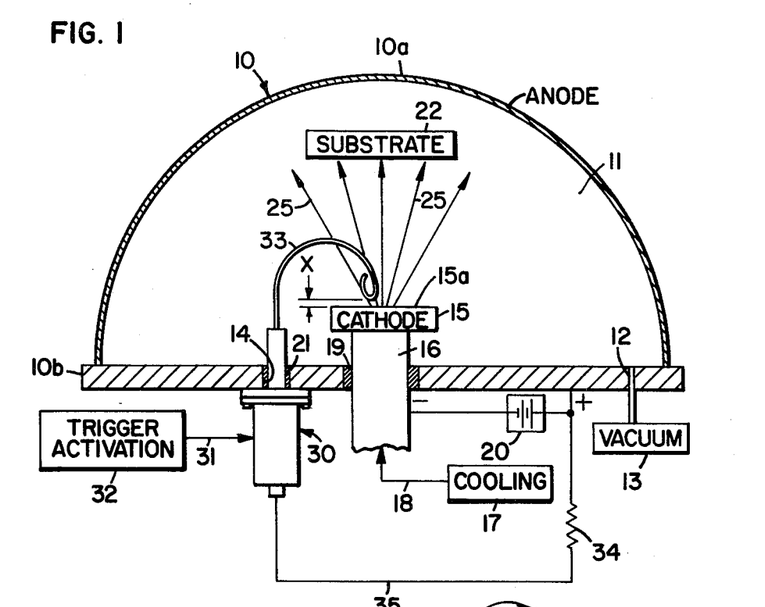
FIG. 1 is a diagrammatic representation of a physical vapor deposition chamber assembly, illustrating the basic components of an electric arc vapor deposition structure, and the general relationship of an arc-initiating trigger apparatus with respect thereto.

Referring to the Drawing, there is generally illustrated in FIG. 1, a diagrammatic representation of an electric arc vapor vacuum deposition system in which the present invention is particularly useful. It is emphasized that FIG. 1 is only a diagrammatic representation of such a system, which generally schematically illustrates those basic portions of an electric arc vacuum vapor deposition system that are relevant to a discussion of the present invention, but that such diagram is by no means complete in detail. For a more detailed description of such an invention, one may refer to U.S. Pat. No. 3,783,231 to Sablev et al. To the extent that such additional disclosure is necessary for an understanding of this invention, the disclosures and teachings of the Sablev et al patent are herein incorporated by reference.

Referring to FIG. 1, there is generally illustrated at 10, a vapor vacuum deposition chamber having an outer shell or chamber 10a and a lower base member 10b connected together with appropriate seal means (not illustrated) to enclose an inner cavity 11 which defines the deposition chamber in which substrates are to be coated. A vacuum line 12 extends into the chamber cavity 11 and is connected to an appropriate vacuum pump 13 for drawing a vacuum within the cavity 11. Other general purpose inlet ports opening into the inner cavity 11 may also be provided, but are not illustrated, for example, for introducing reactive gasses or other elements into the deposition chamber.

A source of coating material 15, referred to in FIG. 1 as the "Cathode" represents the origin of coating vapor or plasma for the vapor deposition coating process. In an electric arc vapor deposition system, such source of coating material generally represents a physical mass of coating material such as titanium, in solid, generally cylindrical form. The source material 15 is mounted within the deposition cavity 11 by appropriate mounting means, generally illustrated at 16 in the Drawing, which typically has at least a portion thereof projecting through one of the chamber walls to the atmospheric environment. In the diagrammatic illustration of FIG. 1, the mounting means 16 is illustrated as projecting through the base member 10b. Due to the high electrical current levels passing through the cathode during the electric arc vapor deposition process, the cathode typically gets extremely hot, requiring some type of cooling, which is usually provided by a water flow-through system. Such cooling means is schematically illustrated at FIG. 17 in the Drawing, and communicates with the cathode 15 and cathode mounting apparatus 16 by means of the flow path 18. Appropriate seal and electrical isolation means, generally illustrated at 19 are provided for maintaining the vacuum within the deposition cavity 11 and for electrically isolating the source 15 from the deposition chamber walls 10a and base 10b.

A primary power supply for maintaining power to generate and maintain the electric arc energy of the system is generally illustrated at 20. The positive terminal of the power supply is operatively connected to the chamber 10, which forms the "anode" of the electric arc system. The negative terminal of the power supply 20 is operatively connected through the source mounting means 16 to the source material 15, which source material acts as the "cathode" of the electric arc system. It will be appreciated that the power supply designation illustrated in the Drawing is schematic only, and that appropriate power supply means are provided for performing the electric arc energization. It will also be noted that the entire outer chamber (i.e. 10a and 10b) in the figure illustrated, form the anode of the structure. Other anode configurations, could equally well be used. Further, anode structures physically mounted within the chamber cavity 11 separate from the chamber walls and base separately biased to act as the anode of the electric arc system (see for example U.S. Pat. No. 3,625,848 to Snaper), could be used.

The item(s) to be coated within the chamber are typically referred to as substrates, and are generally illustrated in the figure at 22. The substrates are appropriately mounted within the chamber, and may also be electrically biased and/or heated. None of such structures are illustrated herein, as they do not form a part of this invention.

An arc-initiating trigger assembly 30 as applicable to this invention is, mounted to the chamber 10 adjacent the source 15, and has a portion thereof extending through a trigger inlet port 14 of the chamber and into the inner deposition cavity 11. Trigger seal and electrical isolation means, only diagrammatically illustrated at 21, are provided for maintaining the vacuum seal of the inner cavity 11 and for providing electrical isolation between the trigger 30 and the chamber anode 10. Appropriate Trigger Activation means, generally designated at 32, are provided for activating the trigger assembly 30, by means of a signal flow path 31. The trigger apparatus 30 has an arc-initiating wire member 33, mounted within the inner chamber 11 and (in the preferred embodiment) connected directly to the trigger assembly for movement into and out of engagement with the upper surface 15a of the cathode source material 15, as illustrated in FIG. 1. Electric current is provided from the power supply 20 to the trigger assembly 30 typically through a resistor 34 and a signal flow path 35. As will be described in more detail hereinafter, when the arc-initiating wire member 33 is positioned so as to engage the upper surface 15a of the cathode 15, an electrical closed circuit is established from the power source 20, through the resistor 34 and signal flow 35, the trigger assembly 30 and its arc-initiating wire 33, and through the cathode 15 and cathode support structure 16, back to the power supply 20. It will be understood that a number of variations of applying and supplying electrical current to the trigger assembly 30 can be configured, as will be appreciated by those skilled in the art, and that the particular diagrammatic representation illustrated in FIG. 1 is only conceptual in nature.

In general, the trigger assembly 30 is operable to move the arc-initiating wire member 33 into and out of engagement with the upper surface 15a of the cathode source 15, as determined by signals from the Trigger Activation apparatus 32. When the arc-initiating wire 33 engages the cathode 15, a closed circuit path (as previously described) is completed through the wire 33, and current flow ensues between the wire and cathode surface. When the trigger activation means 32 energizes the trigger assembly 30 so as to lift the wire member 33 out of engagement with the upper surface 15a of the cathode source 15, the electrical circuit path between the wire and cathode surface is broken, causing an electrical arc to jump the gap between the wire and cathode surface, thereby initiating an electric arc on the cathode. The "gap" between the wire 33 and cathode surface 15a is designated at "X" in FIG. 1. Upon initiation of the electric arc, the arc path immediately extends between the cathode source and the anode portions of the chamber, and is thereafter maintained by the power supply 20. As previously described such arc paths carry high electric current levels, typically in excess of 30 Amperes. As previously described, the concentration of electric energy passing through the arcs which is visible on the surface of the cathode as "cathode spots", liberates cathode material that forms the coating vapor or plasma, generally designated at 25 in FIG. 1. Typically, means (not illustrated) are provided for maintaining such cathode spots on the upper surface 15a of the cathode source. Material liberated from the cathode surface generally travels in a line-of-sight direction outwardly from the cathode source surface 15a, and generally disperse throughout and fill the internal cavity 11 of the coating chamber 10. The substrate(s) 22 are appropriately mounted to intercept the coating vapor 25, and are coated thereby, as is well-known in the art.

Periodically during a deposition coating process or "run", the electric arc on a given cathode surface 15A extinguishes, temporarily terminating the coating process. When this happens, an appropriate arc-sensing apparatus indicates the absence of the electric arc and causes the trigger activation apparatus 32 to re-energize the trigger assembly 30 so as to initiate another electric arc on the cathode, as previously discussed. Such arc sensing circuitry or apparatus is well-known in the art, and is not illustrated in the figure, other than in its general nature as the Trigger Activation network 32. Typically, however, such arc-sensing apparatus is in the form of an electrical circuit which detects the change in electrical conditions, or within the arc sustaining circuit, that results when the electric arc is extinguished.

Figure 2:
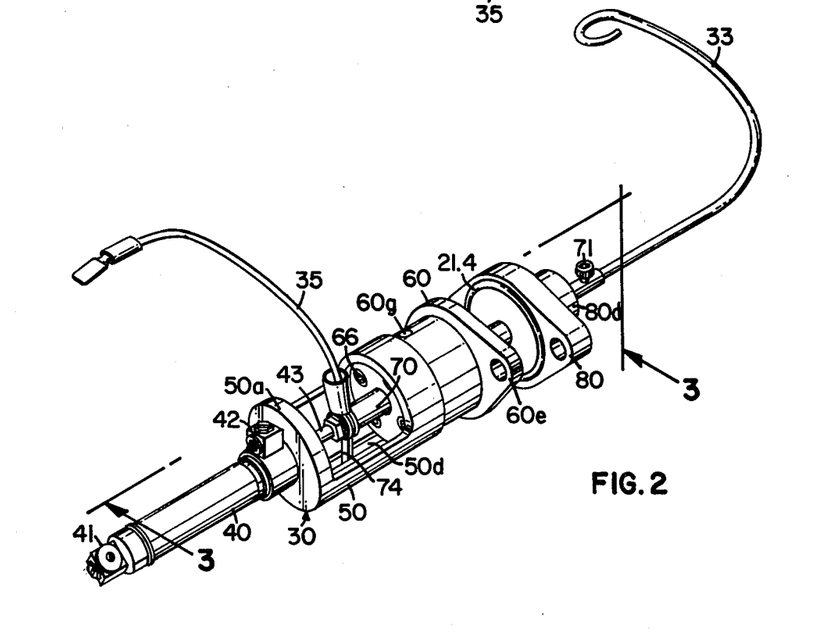
FIG. 2 is a perspective view of an electric arc trigger activating assembly constructed according to the principles of this invention.
Figure 3:
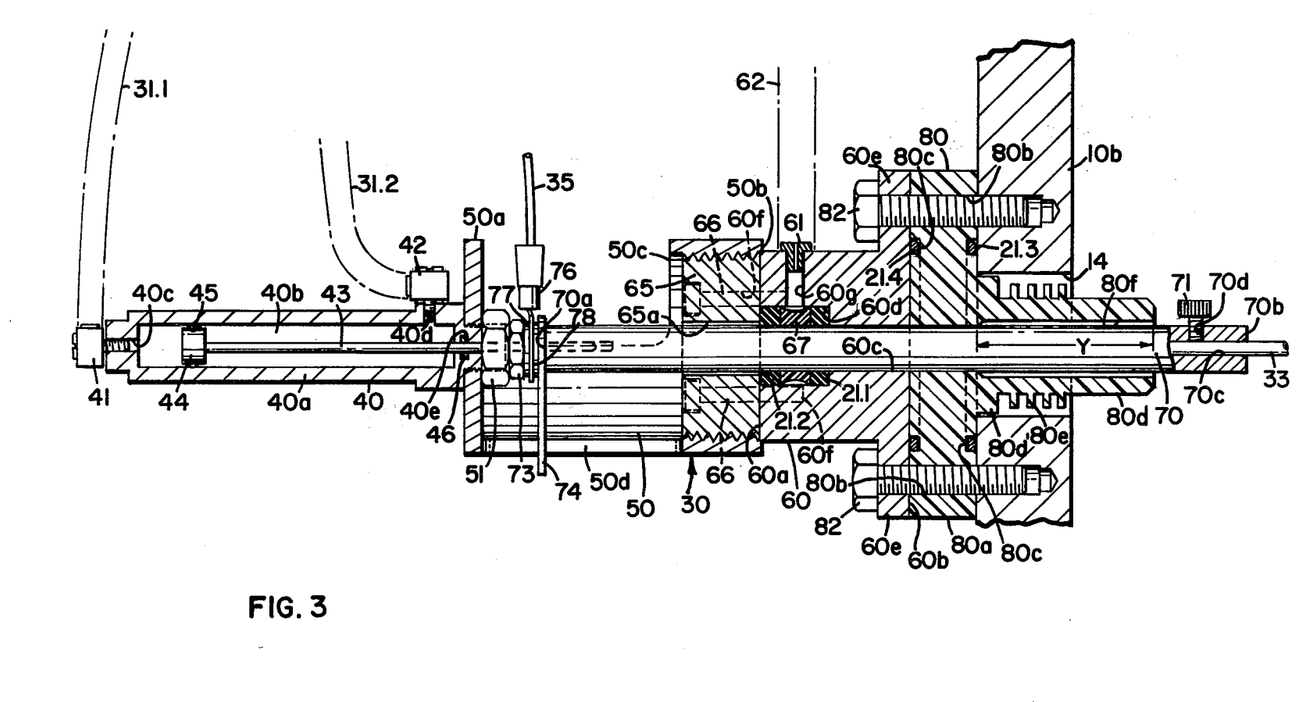
FIG. 3 is a cross-sectional view of the electric arc trigger activating assembly illustrated in FIG. 2, as generally viewed along the vertical plane taken along the Line 3—3 of FIG. 2 illustrating the plunger members in a retracted position and illustrating the trigger assembly as connected to a deposition chamber wall.
Figure 4:
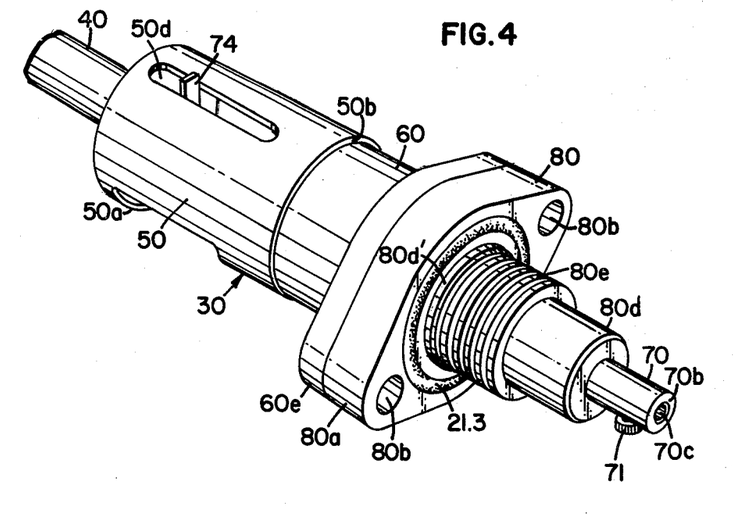
FIG. 4 is a perspective view of the electric arc trigger apparatus illustrated in FIG. 2, as generally viewed from the opposite side and end than in FIG. 2.

Perspective views of a preferred construction of a trigger assembly 30, which incorporates the principles of this invention are illustrated in FIGS. 2 and 4. A more detailed cross-sectional view of the trigger assembly 30 is illustrated in FIG. 3 as such assembly would appear when mounted to a deposition chamber wall, and when the plunger member is positioned in a "retracted" position that would cause an attached arc-initiating wire 33 to engage the cathode surface 15a. Referring to FIGS. 2-4, a pneumatic air cylinder 40 is diagrammatically illustrated. The pneumatic cylinder 40 may be of any appropriate construction, and is in the preferred embodiment a positive action linear pneumatic drive cylinder that uses air pressure for moving a piston/plunger element through precise one inch push-/pull strokes along a linear axis. The pneumatic cylinder 40 generally has an outer housing 40a defining an internal cylindrical cavity 40b having first and second inlet ports 40c and 40d opening into the inner cavity 40b. Air fittings 41 and 42 are respectively connected to pneumatic air pressure lines 31.1 and 31.2 which are respectively connected to the first and second inlet ports 40c and 40d of the cavity 40b, for providing air passageways through such ports and to the respective pneumatic air lines. The air lines 31.1 and 31.2 collectively comprise the activating signal flow path (designated at 31 at FIG. 1) for the trigger assembly 30. The pneumatic air cylinder housing further defines an outlet port 40e axially aligned with the cylinder cavity 40b, which slidably accepts a cylindrical plunger shaft member 43 for axial movement therethrough. That end of the air cylinder plunger shaft 43 located within the cavity 40b is connected to a piston member 44, for axial movement within the inner cavity 40b, as indicated in FIG. 3. The other end of the plunger shaft 43 which axially extends out of the cylinder outlet 40e is threaded for attachment to the trigger plunger shaft, as will be hereinafter described. Appropriate seal means, generally indicated at 45 are provided between the piston 44 and the inner walls of the cylinder 40a, to provide a seal between the two inlet ports 40c and 40d of the cavity and to separate the cavity into two chambers. Similary, appropriate seal means, generally indicated at 46, slidably engage the pneumatic cylinder plunger 43 adjacent the cylinder outlet 40e, for providing a seal for air pressure within the chamber 40b. While general standard features of such a pneumatic air cylinder have been described above, it will be understood that such description is general in nature and that the invention is not limited to such details, but that any appropriate pneumatic cylinder can be used.

In the preferred embodiment, the pneumatic air cylinder is a double action air cylinder, manufactured by Clippard, type SDR 08 1, which is activated by air pressure received through the pneumatic air lines 31.1 and 31.2, to slidably move the piston 44 and attached plunger shaft 43 through one inch strokes in the axial direction of the plunger shaft 43. As illustrated in FIG. 3, the piston 44 is positioned in its "retracted" position (i.e. positioned to the far left as viewed in FIG. 3). The pneumatic cylinder 40 is a "positive" action type that requires the injection of air pressure against the respective faces of the piston 44, for movement to occur. There are no springs involved in the cylinder action. Accordingly, the "same" movement force can be applied by the plunger shaft 43 to a workpiece (such as the trigger plunger, hereinafter described) in both directions of movement of the piston 44. This is in marked contrast to prior art electromagnetic trigger structures wherein the engagement and disengagement forces available from such electromagnetic trigger assemblies differ significantly, or where the means for exerting the forces are very different. The energizing air applied to the pneumatic cylinder through the pneumatic air lines 31.1 and 31.2 is provided by appropriate Trigger Activation means 32 (see FIG. 1). Any appropriate drive and control means can be employed for this purpose, that applies the desired differential air pressure for driving the piston 44 within the cylinder cavity 40b at the desired time. In a preferred construction of such Trigger Activation means 32, an electronic timing circuit is used for providing electronic activation signals to four-way air valve drive means which provide the appropriate air flow charges through the pneumatic air lines 31.1 and 31.2. Design particulars of such trigger activation means will be readily apparent to those skilled in the art, further description thereof, not being necessary to an understanding of this invention.

The output end of the pneumatic air cylinder housing 40 is threaded through a bore in the mounting end plate 50a of a primary trigger housing member 50. A lock nut 51 is threaded onto the end of the pneumatic air cylinder 40, to lock the pneumatic air cylinder into fixed engagement to the mounting end plate 50a, as illustrated in FIG. 3. The primary trigger housing 50 is of generally hollow cylindrical shape external from the mounting end plate 50a toward an opposite open, internally threaded end 50b, and is coaxially aligned with the pneumatic air cylinder housing 40. A portion of the outer trigger housing wall is cut-off at 50c, and an alignment slot 50d longitudinally extends through the outer wall from a position adjacent the mounting end plate 50a and toward the open end 50b. In the preferred embodiment the alignment slot 50d extends in a direction parallel to the central axis of the trigger housing 30, and defines a linear guide slot; however, it will be understood that other configurations of such guide assembly could be used.

A shaft seal housing 60 extends between first and second ends 60a and 60b respectively and defines an internal cylindrical passageway 60c axially extending therethrough. The passageway 60c has an enlarged portion 60d thereof, formed adjacent the first end 60a of the housing 60. A pair of mounting flange portions 60e extend radially outward from the main body of the shaft housing 60 and have holes formed therethrough for receiving mounting bolt members. A plurality of threaded holes 60f are formed within the first end 60a of the seal housing (see FIG. 3). A radially extending threaded hole 60g forms a passageway between the outer surface of the seal housing 60 and the enlarged portion of the internal passageway 60d. An air fitting 61 is threaded into the radially extending hole 60g and is mounted to a vacuum line illustrated in phantom at 62. The air fitting 61 has a passageway formed therethrough, providing direct communication between the vacuum line 62 and the enlarged portion of the internal passageway 60d through the hole 60g. The vacuum line is operably connected to an appropriate vacuum pump (not illustrated). An externally threaded cap member 65, having an internal cylindrical bore 65a formed therethrough is coaxially aligned with the shaft seal housing 60 such that the threaded bore 65a is in coaxially alignment with the cylindrical internal passageway 60c of the seal housing 60, and is fixedly secured to the first end 60a of the seal housing by means of a plurality of screws 66 aligned with and threaded into the plurality of threaded holes 60f of the seal housing 60. The combined seal housing 60 and attached cap member 65 is threaded into the threaded end 50b of the primary trigger housing 50 to form a coaxially aligned unit with the pneumatic air cylinder 40.

A trigger plunger shaft member 70 extending between first and second ends 70a and 70b is coaxially mounted within the cylindrical inner passageway 60c of the seal housing and through the cylindrical bore 65a of the cap member 65, with its second end 70b projecting (when operatively mounted as hereinafter described) within the deposition chamber cavity 11. An axially threaded passageway extends into the plunger shaft member 70 through its first end 70a, and an unthreaded axial passageway 70c extends into the trigger plunger shaft member 70 through its second end 70b. A radially extending threaded hole 70d projects from the outer surface of the trigger plunger shaft 70 adjacent its second end 70b and opens into the axially extending hole 70c. A set screw 71 is threaded into the hole 70d. The threaded end of the pneumatic air cylinder plunger shaft 43 is axially threaded into the first, threaded end 70a of the trigger plunger shaft 70 and is locked in place by means of a retaining nut 73, placing the two plunger shafts 43 and 70 in coaxial alignment with one another.

An alignment tab 74 is keyed to the first end 70a of the trigger plunger shaft 70 for fixed orientation and motion therewith about the central axis of the plunger shaft 70, and has an elongated tab member radially extending outward from the shaft axis and through the alignment guide slot 50d of the primary trigger housing 50. The alignment tab 74 slidably moves in the longitudinal direction within the alignment guide slot 50d as the trigger plunger shaft 70 axially reciprocates, preventing the plunger shaft 70 from rotating about its central axis.

An electrical washer-type connector, generally designated at 76, is mounted over the threaded end portion of the pneumatic cylinder plunger shaft 43, is sandwiched between a pair of washers 77 and 78, and is secured along with the alignment guide tab 74 to the first end 70a of the trigger plunger shaft 70, by the nut 73. The connector 76 is connected to an electrical conductor 35, which comprises the signal flow path 35 of FIG. 1, and provides an electrical connection from the power supply 20 to the trigger plunger shaft 70.

A pair of annular seal members 21.1 and 21.2 are mounted within the enlarged internal passageway portion 60d of the shaft seal housing 60 for cooperatively slidably engaging the outer cylindrical surface of the trigger plunger shaft member 70 as it reciprocates longitudinally within the seal housing. An annular nylon spacer member 67 is mounted between the seals 21.1 and 21.2, and radially addresses the vacuum pump port 60g, permitting differential pumping between the seal members 21.1 and 21.2. The end cap 65 retains the seals and spacer member in place within the cavity 60d. The multi-seal arrangement of seals 21.1, and 21.2 and spacer 67 provides an air-tight seal with the trigger plunger shaft, for maintaining the vacuum seal of the internal cavity 11 of the deposition chamber 10, and comprises in part the seal means 21 illustrated in FIG. 1. The multi-seal arrangement also provides a slidable bearing surface for axially guiding the plunger shaft 70 as it reciprocates longitudinally back and forth through the shaft seal housing 60. The multi-seal arrangement is positioned "downstream" from the entrance to the deposition chamber, such that the seal members 21.1 and 21.2 engage that longitudinal surface portion of the trigger plunger shaft 70 which has not been exposed to the coating plasma 25 within the chamber. Therefore, damage to the seal members 21.1 and 21.2 as a result of frictional engagement with occluded matter deposited on the trigger plunger shaft 70, is minimized. Further, that seal member 21.1 located closest to the deposition chamber is axially spaced far enough away from the opening into the chamber, and the dimensional tolerances between the plunger shaft 70 and the inner cylindrical walls of the internal passageway 60c are small enough such that little if any of the coating material migrates longitudinally between the plunger shaft 70 and the internal passageway 60c wall so as to directly coat the seal member 21.1.

In the preferred construction of the invention, the primary portions of the trigger assembly hereintofore described (i.e. the primary trigger housing 50, the shaft seal housing 60, the cap member 65, the trigger plunger shaft 70 and the guide tab member 74) are constructed of stainless steel. However, it will be understood that other materials could also be used, as long as such materials are selected for providing a good electrical conductivity path between the conductor 35 and the second end 70b of the trigger plunger shaft member.

A spacer/feed-through and shield member 80 is configured for coaxially mounting with the seal housing 60 and provides an electrically insulating barrier between the deposition chamber wall 10b and the shaft seal housing 60a and the trigger plunger shaft 70. In the preferred embodiment, the feed-through member 80 is constructed of nylon, which is a good insulator, has good temperature characteristics and low outgassing properties; however, other materials could also be used. The feed-through member 80 has an enlarged flange portion 80a configured for sandwiched engagement between the second end 60b of the shaft seal housing 60 and the outer surface of the deposition chamber wall 10b. In the preferred embodiment illustrated, the peripheral shape of the enlarged flange portion 80a is similar to that of the mounting flange portions 60e of the shaft seal housing 60 (see FIGS. 2 and 4) and includes a pair of mounting holes 80b aligned with those of the shaft seal housing mounting portion, through which a pair of nylon mounting bolts 82 pass. The enlarged flange portion 80a has a pair of annular grooves 80c in its outer surfaces in which a pair of O-rings 21.3 and 21.4 are mounted. The mounting bolts 82, pass through the aligned mounting holes of the shaft seal housing 60e and the holes 80b through the flange portion 80a of the spacer 80 and, are threaded into the base plate 10b of the deposition chamber, fastening the entire trigger assembly 30 to the deposition chamber wall. When so mounted, the O-rings 21.3 and 21.4 provide with the seal members 21.1 and 21.2 an air-tight seal at the trigger inlet port 14 for the deposition chamber cavity 11 and comprise the seal means 21 of FIG. 1. It will be noted that the O-ring seals 21.3 and 21.4 are shielded from contamination by the coating plasma 25 within the deposition chamber 11.

The feed-through spacer member 80 further defines a shield member, generally designated at 80d, axially aligned with and overlying the trigger plunger shaft 70 and sized to fit within and project through the trigger inlet port 14 of the deposition chamber wall 10b. The forward end of the shield portion 80d terminates at a position spaced slightly back from the set screw 71 of the plunger shaft 70 when the shaft 70 is positioned in its "retracted" position (as illustrated in FIG. 3). The shield member 80d has a "centering" shoulder 80d' slightly raised from the forward surface of the enlarged flange portion 80a and configured for centering the shield member 80 within the inlet port 14 of the chamber wall 10b. The shield member 80d also has a plurality of spaced annular flute members 80e axially spaced along the outer surface of the shield member 80d between the shoulder 80d' and the free end of the shield member portion 80d. In the preferred embodiment, the flute members 80e are all axially disposed so as to lie "within" the inlet port of the deposition chamber 10b; however, such flute members could also extend into the deposition chamber, beyond the inner wall of the chamber. The flute members extend the "insulating life" of the spacer 80 over an extended coating period when the coating material being deposited is "conductive". That portion of the inner bore 80f of the shield member 80d, through which the trigger plunger shaft 70 moves, is enlarged (see FIG. 3) as compared to the diameter of the passageway through the rear flange portion 80a of the spacer member 80. The length of such enlarged inner diameter portion generally coincides with or is slightly longer than the stroke (i.e. the axially movement distance) of the trigger plunger shaft member, and allows that portion of the trigger plunger shaft 70 (indicated at "Y" in FIG. 3) to become coated for an extended period from the coating plasma 25, without causing sticking or binding within the feed-through member 80.

An arc-initiating wire member 33 is inserted into the axial hole 70c through the second end 70b of the trigger plunger shaft 70 and is fixedly secured in place therein by the set screw 71. The arc-initiating wire is constructed of molybdenum in the preferred embodiment and is bent in a gradual downwardly depending curve toward and to overly the cathode source material 15, for engagement therewith. The end of the wire 33 that axially engages the cathode surface 15a is slightly hooked so as to provide a smooth contact surface with the cathode. The gradual sweep or curve of the wire makes the wire more rigid, as it engages and disengages from the cathode. As secured to the trigger plunger shaft 70, the arc-initiating wire 33 will repetitively contact the cathode surface 15a at the same spot on the surface, since fact that rotation of the plunger shaft about the shaft's central axis is prevented by engagement of the alignment tab 74 within the alignment slot guide 50d. The length of the arc-initiating wire 33 is configured, in combination with its bend radius, such that when the plunger shaft 70 is in its uppermost (disengaged) position the spacing of the wire's free end from the upper cathode surface 15a (i.e. the dimension "X" in FIG. 1) is slightly less than the "stroke" movement of the plunger shaft 70.

As can readily be appreciated, the trigger assembly of this invention provides a highly reliable, inexpensive and simple arc-initiating apparatus for electric arc vapor deposition systems, which needs virtually no maintenance over extended periods of operative use. With prior art electromagnetic trigger assemblies the trigger apparatus, and particularly the seal means thereof, required thorough cleaning and/or replacement after each deposition cycle. Oftentimes, the entire trigger assembly itself required replacement after one or several deposition runs. With the present invention, the trigger apparatus 30 has been found to require little or no maintenance over many deposition runs, and may not require replacement or cleaning for up to one month at a time over normal use of the deposition chamber. When cleaning is required, the spacer/shield member can be rapidly replaced with a clean unit.

The pneumatic air cylinder 40 provides positive push and pull force through the air cylinder plunger 43 to the trigger plunger shaft 70 for moving the arc-initiating wire 33 into and out of engagement with the cathode surface 15a. The preferred force selected for the preferred embodiment of the invention is a 20 pound force in both directions, a force that is more than twice as great as previously available with prior art electromagnetic structures. It will be understood, however, that configurations of the pneumatic cylinder and drive apparatus could be made that would employ differential pressure for lowering and raising the arc-initiating wire. For example, larger raising, or lifting force may be desired to safeguard against possible sticking or welding of the arc-initiating wire to the cathode surface, than would be required for the wire lowering operations. The "direct" connection of the arc-initiating wire to the trigger plunger 70 and its gradual bend to the cathode surface 15a, enables all of the push/pull drive force from the pneumatic air cylinder to be applied directly to linear movement of the arc-initiating wire into and out of engagement with the cathode surface. No lever arrangements or pivotal action mounting of the arc-initiating wire, and no spring arrangements are used or required. As a result, welding of the wire 33 to the cathode surface rarely occurs. The alignment tab and guide structure for restraining rotational motion of the trigger plunger 70 around its axis, insures that the arc-initiating wire 33 will strike the cathode surface 15a at the same location each time the trigger apparatus is activated. Further, since there are no critical spring members to damage, electrical and normal thermal heating of the trigger assembly 30 have little effect on the reliability of the assembly.

The critical seal members 21, which maintain the seal of the vacuum chamber through the trigger assembly, are protected from the coating plasma 25 by means of the feed-through insulator member 80. Those particles from the coating plasma with diffuse down into the trigger inlet port 14 of the chamber 10b, will be primarily deposited upon those upper surfaces of the flute members 80e which address the coating chamber cavity 11. Such coating will be progressively less on the flute members 80e as the shoulder 80d' is approached. Little if any of the coating plasma 25 will reach and deposit upon the O-ring seal 21.4 which is fairly well shielded from the coating environment of the internal chamber 11. Further, even if the forward or upper surfaces of the flute members 80e become entirely coated with conductive coating material, the lower or rearwardly facing portions of such flute members, which are located in the "shadow" area with respect to coating plasma migrating down into the trigger inlet port 14, will generally not become coated to the point that they provide a conductive path for electricity. Therefore, electrical shorting as a result of plasma coating will not readily occur across, or down the length of the insulator member 80. Similarly, the forward seal 21.1 of the multi-seal arrangement which engages the plunger shaft 70 is also well protected from the coating plasma of the chamber, due to its position remote from the trigger inlet port 14 and to the close tolerances between the outer surface of the shaft 70 and the internal cylindrical guide wall in which it rides. If, however, over a period of time the first seal 21.1 of the multi-seal arrangement were to become damaged or to leak, the vacuum line and pump provided through the vacuum port 60g and the vacuum line 62 enables the multi-seal arrangement to be differentially pumped to maintain the vacuum of the chamber vacuum. Such differential pumping between the seals also provides for removal of atmospheric gases that might otherwise be introduced into the chamber as a result of using a single trigger shaft seal that becomes leaky or damaged.

Further, as previously mentioned, that portion of the plunger shaft illustrated at "Y" in FIG. 3 is normally exposed to the coating vapor or plasma during a coating operation, since the plunger shaft 70 is normally positioned such that the "Y" portion of the plunger shaft axially extends into the coating chamber 11 beyond the end of the feed-through shield member 80d. It will be noted that when the plunger shaft 70 is thus positioned, the arc-initiating wire 33 is in spaced, "disengaged" position relative to the cathode surface 15a. Even though coating vapor is deposited upon and builds up on the exposed portion of the plunger shaft 70, such build-up does not affect subsequent axial motion of the plunger shaft through the feed-through member 80 for an extended period of time, due to the enlarged inner radius 80f of the forward shield member portion 80d of the feed-through spacer 80, which prevents sticking or binding of the shaft as it passes therethrough. The slim-line design of the trigger assembly, made possible by use of the pneumatic linear-motion activation cylinder, allows the trigger assembly to be placed in close proximity to the cathode source material, its placement being limited only to the shape and construction of the cathode itself and its mounting means.

While the present invention has been described with respect to its application as illustrated in a preferred embodiment, it will be understood that a number of variations of the embodiment and the materials employed in its construction are possible. Such modifications of the invention will become apparent to those skilled in the art in light of the foregoing description. This description is intended to provide a specific example of an embodiment which clearly distinguishes and discloses the present invention. Accordingly, the invention is not limited to the described embodiment, or the use of specific elements or materials described herein. All alternative modifications and variations of the present invention which fall within the broad scope of the appended claims are covered.

What is claimed is:

1. An arc-initiating apparatus of the type suitable for mounting to a port of a vapor deposition chamber, for moving an arc-initiating rod into and out of engagement with a cathode source surface during an electric arc vapor deposition process, comprising:
   (a) a housing defining an internal cavity having oppositely disposed ends;
   (b) means for mounting said housing to a port of a vapor deposition chamber;
   (c) a plunger shaft axially extending between first and second ends and slidably mounted for axial movement within said housing internal cavity;
   (d) seal means arranged and configured for maintaining a vacuum seal at said port, between said chamber and said housing;
   (e) contact rod means operatively connected to said second end of said plunger for moving in response thereto, and having an engagement portion configured and arranged for selectively engaging a surface of a cathode source mounted in the vapor deposition chamber, said contact rod means being operable in response to axial movement of said plunger shaft to selectively engage and disengage the cathode source surface; and
   (f) pneumatic cylinder means having a prime mover operatively connected with said first end of said plunger shaft for positively axially moving said plunger shaft between extended and retracted positions, whereby when said plunger shaft is positioned in said retracted position, said contact rod means operatively engages said cathode source surface, and when said plunger shaft is positioned in said extended position, said contact rod means is moved out of engagement with said cathode source surface.

2. An arc-initiating apparatus as recited in claim 1, further including means operatively connected with said plunger shaft, for maintaining the rotational position of said shaft about its axis at a fixed angular attitude, when said shaft moves between said extended and retracted positions.

3. An arc-initiating apparatus as recited in claim 1, wherein said seal means comprises:
   (a) first seal means mounted within said cylindrical cavity and cooperatively engaging said plunger shaft, for forming a sliding seal with said plunger shaft; and
   (b) second seal means operatively disposed between said mounting means and said chamber for maintaining a vacuum seal therebetween.

4. An arc-initiating apparatus as recited in claim 3, further including shield means coaxially mounted with said plunger shaft and configured to extend into the vapor deposition chamber, for shielding said second seal means from coating by plasma coating material within the deposition chamber.

5. An arc-initiating apparatus as recited in claim 4, wherein said shield means comprises an electrical insulator material.

6. An arc-initiating apparatus as recited in claim 5, wherein said shield means includes a plurality of fluted portions coaxially aligned about said plunger shaft, and oriented so as to intercept coating plasma material traveling from the coating chamber toward said second seal means.

7. An arc-initiating apparatus as recited in claim 6, wherein said mounting means includes insulator means disposed between said housing and the deposition chamber, electrically isolating said housing from said chamber; and wherein said second seal means cooperatively engages said insulator means 8. An arc-initiating apparatus as recited in claim 7, further including electrical conductor means operatively connected with said plunger shaft for providing electric current flow thereto; whereby an electric current flow path is established through said shaft and said contact rod means to said surface of said cathode when said contact rod means is operatively positioned to engage said cathode surface.

9. An arc-initiating apparatus as recited in claim 2, wherein said housing defines a laterally extending alignment slot; and wherein said plunger shaft includes a radially extending tab member arranged and configured to slidably move within said alignment slot; whereby when said plunger shaft moves between said retracted and said extended positions, radial alignment of said shaft is maintained in a position as determined by said shaft and tab assembly.

10. An arc-initiating apparatus as recited in claim 1, wherein said contact rod means comprises a molybdenum contact wire; and further including means for directly connecting said wire to said second end of said plunger shaft for common movement therewith.

11. An arc-initiating apparatus as recited in claim 1, wherein the pneumatic cylinder means includes means for moving said prime mover thereof, with substantially equal force in both said retracted and said extended directions.

12. An arc-initiating apparatus as recited in claim 11, wherein said moving force is between 10 and 30 pounds.

13. An arc-initiating apparatus as recited in claim 3, wherein said first seal means comprises a pair of seal members operatively engaging said plunger shaft and axially spaced therealong in said housing cavity, a dual seal configuration.

14. An arc-initiating apparatus as recited in claim 13, further including access means formed through said housing and opening into said housing cavity at a position located between said pair of seal members; and vacuum pump means operatively connected to said access port for providing differential evacuation pumping of said housing cavity between said pair of seals.

15. An arc-initiating trigger apparatus for use with an electric arc vacuum vapor deposition chamber comprising:
(a) a housing having one end suitable for attachment to a vacuum vapor deposition chamber adjacent an inlet port extending into an internal cavity of the chamber;
(b) a plunger longitudinally extending between first and second ends and configured for passing an electrical signal therethrough;
(c) means for mounting said plunger for oriented longitudinal movement between extended and retracted positions within said housing, wherein said second end of said plunger reciprocally moves toward and away from said one end of said housing;
(d) seal means cooperatively engaging said plunger and said housing for forming a dynamic seal therebetween as said plunger moves;
(e) shield means operatively mounted adjacent said one end of said housing and configured to project into said chamber inlet port, for shielding said seal means from vapor deposition particles passing through said inlet port from said chamber; and
(f) drive means operatively connected to said plunger adjacent said first end thereof for reciprocally, positively moving said plunger between said extended and said retracted positions.

16. An arc-initiating trigger apparatus as recited in claim 15, including means for mounting said one end of said housing to the vapor deposition chamber, wherein said second end of said plunger operatively addresses said inlet port.

17. An arc-initiating trigger apparatus as recited in claim 15, further including electrical insulator means interposed between the chamber and said one end of said housing for electrically isolating said housing from said chamber.

18. An arc-initiating trigger apparatus as recited in claim 16, including mounting seal means for forming a vacuum seal between said chamber and said mounting means.

19. An arc-initiating trigger apparatus as recited in claim 15, wherein said second end of said plunger is configured to removably receive an arc-initiating wire member.

20. An arc-initiating trigger apparatus as recited in claim 19, including electrical connection means operatively connected with said plunger adjacent said first end thereof, for connection to an electrical power source; whereby an electrical path is established from said connector, through said plunger and to an arc-initiating wire mounted to said second plunger end.

21. An arc-initiating trigger apparatus as recited in claim 15, wherein those portions of said shield means exposed to vapor particles from said chamber cavity, comprise electrically insulative material.

22. An arc-initiating trigger apparatus as recited in claim 21, wherein said shield means slidably coaxially engages said plunger adjacent said second end thereof.

23. An arc-initiating trigger apparatus as recited in claim 22, wherein said shield means includes a plurality of flute members coaxially aligned with said plunger.

24. An arc-initiating trigger apparatus as recited in claim 15, wherein said seal means includes a plurality of seal rings axially spaced along said plunger and interposed between said plunger and said housing.

25. An arc initiating trigger apparatus as recited in claim 15, wherein said drive means comprises a pneumatically actuated drive means for positively moving said plunger between said retracted and said extended positions with generally the same force in both directions of movement.

26. An arc initiating trigger apparatus as recited in claim 15, including means cooperatively connected between said plunger and said housing for repeatedly maintaining a predetermined angular position of said plunger as it reciprocates between said extended and said retracted positions.

27. An arc-initiating trigger assembly for use in combination with an electric arc vacuum vapor deposition chamber of the type having an inlet port opening into a deposition cavity in which an electrode of coating source material suitable for producing a coating plasma is mounted, comprising:
(a) a housing longitudinally extending between first and second ends and defining an internal passageway, said second end being suitable for mounting to a vacuum vapor deposition chamber;
(b) a plunger shaft member extending between first and second ends and operatively mounted for longitudinal reciprocal movement within said housing passageway, said plunger shaft second end longitudinally extending beyond said second end of said housing and being adapted for connection to an arc-initiating conductive wire;
(c) means for mounting said second end of said housing to said chamber at an inlet port of the chamber such that such second end of the plunger extends into said inlet port and addresses the internal deposition cavity defined by said chamber;
(d) first seal means operatively engaging said plunger shaft member and said housing, for forming a dynamic vacuum seal therebetween;
(e) second seal means cooperatively engaging said housing for forming a vacuum seal between said housing and said chamber at said inlet port; whereby said first and said second seal means cooperatively maintain a vacuum seal between the inner deposition cavity of said chamber and the external environment of said chamber, through said inlet port; and
(f) pneumatic drive means operatively connected to said first end of said plunger member for longitudinally reciprocating said plunger member within said housing passageway, wherein said second end of said plunger member reciprocally moves in generally linear manner through said inlet port of said chamber.

28. An arc-initiating trigger assembly as recited in claim 27, including plunger alignment means operatively connected with said plunger for maintaining a predetermined angular position of said plunger as it longitudinally reciprocates.

29. An arc-initiating trigger assembly as recited in claim 27, including shield means mounted for coaxial alignment with said plunger shaft member adjacent its said second end, for preventing coating of said first seal means by deposition particles passing through said inlet port from said deposition cavity.

30. A method of actuating an arc-initiating trigger apparatus of the type used in electric arc vapor deposition chambers containing a coating source material from which an electric arc is struck, said trigger apparatus generally including a housing mounted to the deposition chamber at an inlet port thereof, a plunger member mounted for reciprocal longitudinal movement in said housing and having one end extending through said inlet port into the inner cavity of the chamber, an arc-initiating wire carried by the plunger member and movable thereby into and out of engagement with said coating source material, the method comprising the steps of:
 (a) axially reciprocating the plunger member between extended and retracted positions, wherein the arc-initiating wire carried thereby is moved into and out of engagement with the coating source material;
 (b) maintaining the angular rotation of the plunger member in a predetermined position throughout said reciprocation of the plunger member, wherein said arc-initiating wire repeatedly engages the same portion of said coating source material on each reciprocal cycle; and
 (c) maintaining a vacuum seal at said inlet port and through said trigger apparatus during said reciprocatory motion of said plunger member.

31. The method as recited in claim 30, wherein the step of maintaining a vacuum seal includes providing seal means cooperatively engaging said plunger member, and further including the step of shielding said seal means from coating by particles traveling from said inner cavity of the chamber and through said inlet port during reciprocation movement of said plunger member.

32. The method as recited in claim 30, including the step of positively reciprocating said plunger member with generally equal force applied thereto during movement both toward said extended and toward said retracted positions.

33. The method as recited in claim 32, wherein said force applied to said plunger member is approximately ten pounds or more.

34. The method as recited in claim 32, wherein said reciprocating step is performed with pneumatic drive means operatively connected with said plunger member.

* * * * *